(12) United States Patent
Chu et al.

(10) Patent No.: US 6,205,796 B1
(45) Date of Patent: Mar. 27, 2001

(54) SUB-DEW POINT COOLING OF ELECTRONIC SYSTEMS

(75) Inventors: Richard C. Chu, Poughkeepsie, NY (US); Gregory M. Chrysler, Chandler, AZ (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/281,135

(22) Filed: Mar. 29, 1999

(51) Int. Cl.[7] .............................. F25D 17/06; H05K 7/20
(52) U.S. Cl. ............................. 62/94; 62/259.2; 361/700
(58) Field of Search ................... 62/259.2, 94; 361/700

(56) References Cited

U.S. PATENT DOCUMENTS

| | | | |
|---|---|---|---|
| 3,334,684 | * 8/1967 | Roush et al. | 62/259.2 |
| 5,333,460 | 8/1994 | Lewis et al. | 62/6 |
| 5,365,749 | * 11/1994 | Porter | 62/259.2 |
| 5,471,850 | * 12/1995 | Cowans | 62/223 |
| 5,523,563 | 6/1996 | Moessner | 250/238 |
| 5,570,740 | * 11/1996 | Flores et al. | 165/103.34 |
| 5,578,753 | 11/1996 | Weiss et al. | 73/335.02 |
| 5,706,668 | * 1/1998 | Hilpert | 62/259.2 |
| 5,739,463 | * 4/1998 | Diaz et al. | 174/35 R |
| 5,855,119 | * 1/1999 | Pfister et al. | 62/259.2 |
| 5,934,368 | * 8/1999 | Tanaka et al. | 165/233 |

* cited by examiner

Primary Examiner—William Doerrler
(74) Attorney, Agent, or Firm—Andrew J. Wojnicki, Jr.; Lily Neff

(57) ABSTRACT

Redundant humidity control mechanisms are provided for electronic systems which are cooled to temperatures below the dew point temperature of the ambient environment in which the systems are present. In particular, system environment is controlled in an overall fashion by providing a thermally insulating and substantially sealed enclosure for containing both air coolable and refrigerant coolable components. Humidity control and cooling are both provided in a redundant fashion to ensure reliability of service and availability of the components which are being cooled. Both desiccant-based and refrigeration-based humidity control mechanisms are provided. The present invention also includes embodiments in which multiple heat exchange fluids are employed.

13 Claims, 4 Drawing Sheets

SUB-DEW POINT COOLING OF ELECTRONIC SYSTEMS

BACKGROUND OF THE INVENTION

The present invention is generally directed to cooling electronic systems. More particularly, the present invention is directed to cooling electronic computer systems to temperatures which are sufficiently low that moisture condensation becomes a problem. Even more particularly, the present invention is directed to a method and system for controlling water vapor in an enclosed environment.

As electronic circuit chips become available with more densely packed circuit components, the thermal energy flux produced by these devices increases significantly. Additionally, as these devices are operated at increased clock cycle frequencies, the power required by and within these devices also increases. Accordingly, cooling of electronic circuit components has become an increasingly more significant problem as a result of changes which are continuing to occur in the underlying technology.

A very significant thermophysical behavior is that by operating electronic circuit components, such as computer processors, at lower junction temperatures, these devices run at higher speeds. However, as the junction temperature of these devices decreases through the use of cooling mechanisms, there is a concomitant problem produced because the temperature of the outer surface of the package housing also decreases. Eventually, as the temperature is lowered, the temperature of the outer skin of the package, including electrical interconnections, drops below the dew point temperature of the ambient atmosphere and water starts to condense and then may even freeze. This water vapor has the propensity to cause electrical short circuits. Accordingly, it is seen that an electronic component packaging configuration must be developed which controls the concentration of water vapor in the environment immediately surrounding a sufficiently cooled electronics component or package. Alternatively, packaging configurations which eliminate airborne water vapor must be developed. Accordingly, methods and systems should be developed for controlling water vapor in the environment surrounding an electronic circuit package which is cooled to a temperature which is below the dew point of the ambient atmosphere surrounding the electronics package.

SUMMARY OF THE INVENTION

In accordance with one embodiment of the present invention, a cooled electronic system comprises an electronic module in thermal contact with a cold plate containing channels through which a refrigerant can flow. The module and cold plate are disposed in a thermally insulated enclosure which is sealed against the entry of substantial amounts of ambient air. There is provided a refrigeration mechanism which is located outside of the enclosure for supplying refrigerant to the cold plate. Refrigerant conduits passing through the enclosure in a sealed fashion form a closed refrigerant loop for cooling the electronic module. In this embodiment, water vapor control is at least partially dependent upon the sealed nature of the enclosure. Additionally, this embodiment may also employ an internally or externally disposed tank of dry air as a means for maintaining a positive pressure of air within the enclosure.

In another embodiment of the present invention, water vapor control is provided by a mechanism which removes water vapor from ambient air within the enclosure. In this particular embodiment, the water vapor removal means are optionally provided outside of the enclosure. In a preferred embodiment, the water vapor removal mechanism includes a desiccant disposed within a closed exterior container. An air circulating pump moves air from within the sealed enclosure through the desiccant to remove water vapor and then recirculates the dried air through transport conduits back into the enclosure. The desiccant material is periodically purged of its water content.

In another embodiment of the present invention, a refrigeration mechanism, similar to the embodiment described above, is employed within the same enclosure that contains the components which are to be cooled. However, in this particular embodiment, the electronic system preferably comprises a first set of electronic components through which air cooling alone is sufficient, together with a second set of electronic components for which air cooling is not sufficient. That is to say the second set of electronic components is cooled directly with a cold plate as described above using a refrigerant flowing through it. However, as a further aspect of this embodiment, the refrigerant is also directed via additional conduits through an air/refrigerant heat exchanger and back to the refrigerant cooling mechanism. An air moving (AMD) device moves air through the heat exchanger and past the first set of electronic components for which this air cooling is sufficient. Thus, there is provided a water vapor control mechanism which is particularly applicable to the electronic module which is cooled using a cold plate while at the same time there is provided a mechanism for producing air cooling of the other, typically less critical, electronic circuit components.

In a still further embodiment of the present invention, rather than cooling the cold plate directly with refrigerant, a heat exchanger is provided to remove heat from a heat exchange fluid such as a brine which flows through the cold plate. This cooling system provides a mechanism in which dual heat exchange fluids are employed. As in the previous embodiment, this embodiment also preferably includes a heat exchanger for exchanging heat between air and the heat exchange fluid such as brine which flows through the cold plate and its associated conduits. As above, an air moving device directs air through this second heat exchanger and provides cooling for the air coolable portions of the electronic system. This system is also adaptable for the diversion of a portion of the refrigerant in the first heat exchanger to a humidity control device which is contained within a surrounding enclosure. Thus, in this embodiment, the refrigerant not only acts as the cooling mechanism, but also provides a mechanism for removing water vapor from the enclosed environment.

Accordingly, it is an object of the present invention to operate electronic systems, particularly computer systems, at lower temperatures.

It is also an object of the present invention to prevent the build up of moisture on cooled electronic circuit components.

It is a still further object of the present invention to control the water content of the ambient atmosphere surrounding a cooled electronic system, circuit or module or processor.

It is a still further object of the present invention to provide a means or mechanism for utilizing multiple heat exchange fluids for optimal transport of thermal energy away from electronic circuit components.

It is yet another object of the present invention to provide a cooling system for an electronic system which is reliable and which exhibits component redundancy sufficient to maintain long-term availability of the electrical system being cooled.

It is also an object of the present invention to provide a cooled electronic system which is capable of stand-alone operation requiring minimal servicing and maintenance.

It is an even still further object of the present invention to provide a cooling system for less critical air-cooled components while at the same time providing a cooling mechanism for electronic circuit components having more critical cooling needs.

It is a still further object of the present invention to provide a cooled electronic system without the production of external moisture, sweating or dripping.

It is also an object of the present invention to maintain a low humidity condition within an enclosure containing a coolable electronic system, particularly a computer or a computer processor system.

It is yet another object of the present invention to provide a desiccant-based water removal system which is operable continuously and which is periodically purgable of its water content.

Lastly, but not limited hereto, it is an object of the present invention to control humidity and eliminate condensation in electronic systems which are cooled to sub-dew point temperatures.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
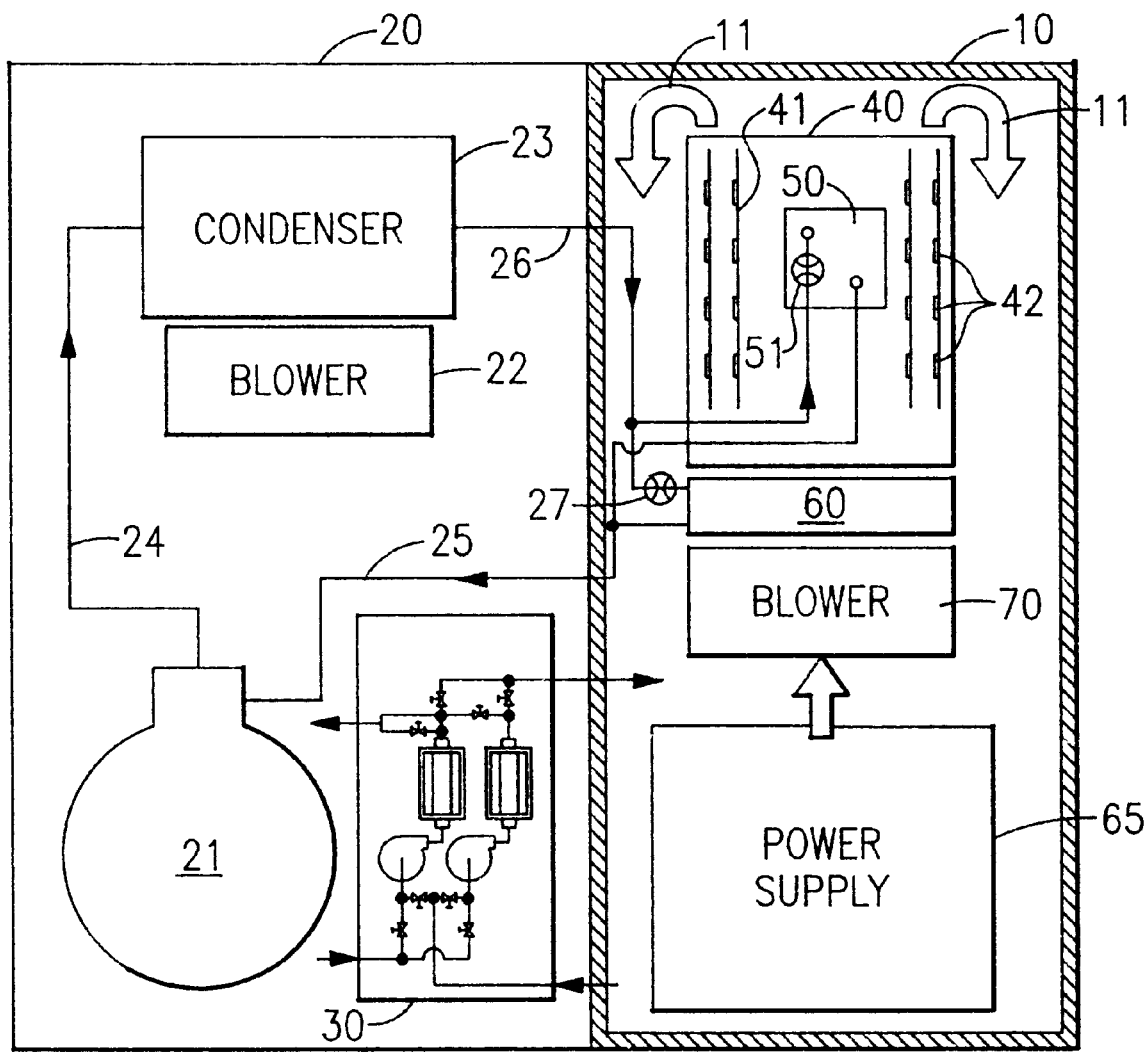
FIG. 1 is a schematic view illustrating one embodiment of the present invention.

FIG. 1 illustrates one embodiment of the present invention in which the components to be cooled are contained within enclosure 10 which is thermally insulative and which is also substantially air tight. However, in accordance with the embodiment of the invention illustrated in FIG. 1, it is not necessary for this enclosure to be as tightly sealed against atmospheric penetration as certain other embodiments of the present invention. The embodiment illustrated in FIG. 1 is also illustrative of a mechanism for dealing with atmospheric water vapor by means of a humidity control mechanism which is exterior to the enclosure.

In particular, the embodiment shown in FIG. 1 illustrates enclosure 10 which is both thermally insulating and sealed against significant amounts of air penetration. Additionally, there is included second frame 20 which is provided for the convenience of containing a means for generating cooled refrigerant and which also contains a mechanism for removing moisture from air contained within enclosure 10.

Enclosure 10 includes the components to be cooled, namely, module 55 (see FIG. 3B) which is covered by and is in thermal contact with cold plate 50. Cold plate 50 is provided to cool electronic circuit components which tend to run faster and/or hotter and are, therefore, more critically in need of cooling. Components which are air-cooled include chips or modules 42 disposed on circuit board 41 which is, in turn, plugged into backplane 40. Chips or modules 42 represent components for which air cooling is sufficient. In particular, air flow for cooling of components 42 is illustrated by means of flow arrows 11. In order to provide a flow of cooling air, blower 70 is provided and is driven by power supply 65 which also acts as the power supply for the components mounted on backplane 40.

Cold plate 50 (such as that described in patent application Ser. No. 08/975,852 filed on Nov. 21, 1997) includes passages therein for the flow of refrigerant. Refrigerants such as R134, R404 and R507 may be employed. Some of the refrigerant is "diverted" from the flow through cold plate 50 so as to flow to air-to-refrigerant heat exchanger 60 across which blower 70 directs air which is cooled within heat exchanger 60 and thus moves over chips 42 to cool them. Expansion valves 51 and 27 are provided in the refrigerant flow path to drop the pressure of the liquid refrigerant and to thereby drop its temperature to the desired level before entering the evaporator.

Cooled refrigerant is supplied from condenser 23 which is cooled by blower 22 through refrigerant conduit 26, to cold plate 50 and also to heat exchanger 60. Conduit 25 returns heated refrigerant from cold plate 50 and from heat exchanger 60 to compressor 21 which compresses the refrigerant before it is supplied to condenser 23 for the purposes of removing thermal energy contained within the compressed coolant.

Thus, compressor 21, condenser 23 and blower 22 provide a mechanism for supplying cooled refrigerant to the interior of enclosure 10 which is referred to herein for convenience as "the electronics frame." On the other hand, frame 20 is referred to herein as the "low temperature cooling frame." Together these two frames are employed together to comprise a total system package. It is also noted that cold plate 50 preferably includes dual sets of passages for refrigerant flow, as described in the patent above. Accordingly, coolant supply means are preferably provided in frame 20 in a redundant fashion (not visible from the front view) for purposes of ensuring system reliability and availability.

Figure 2:
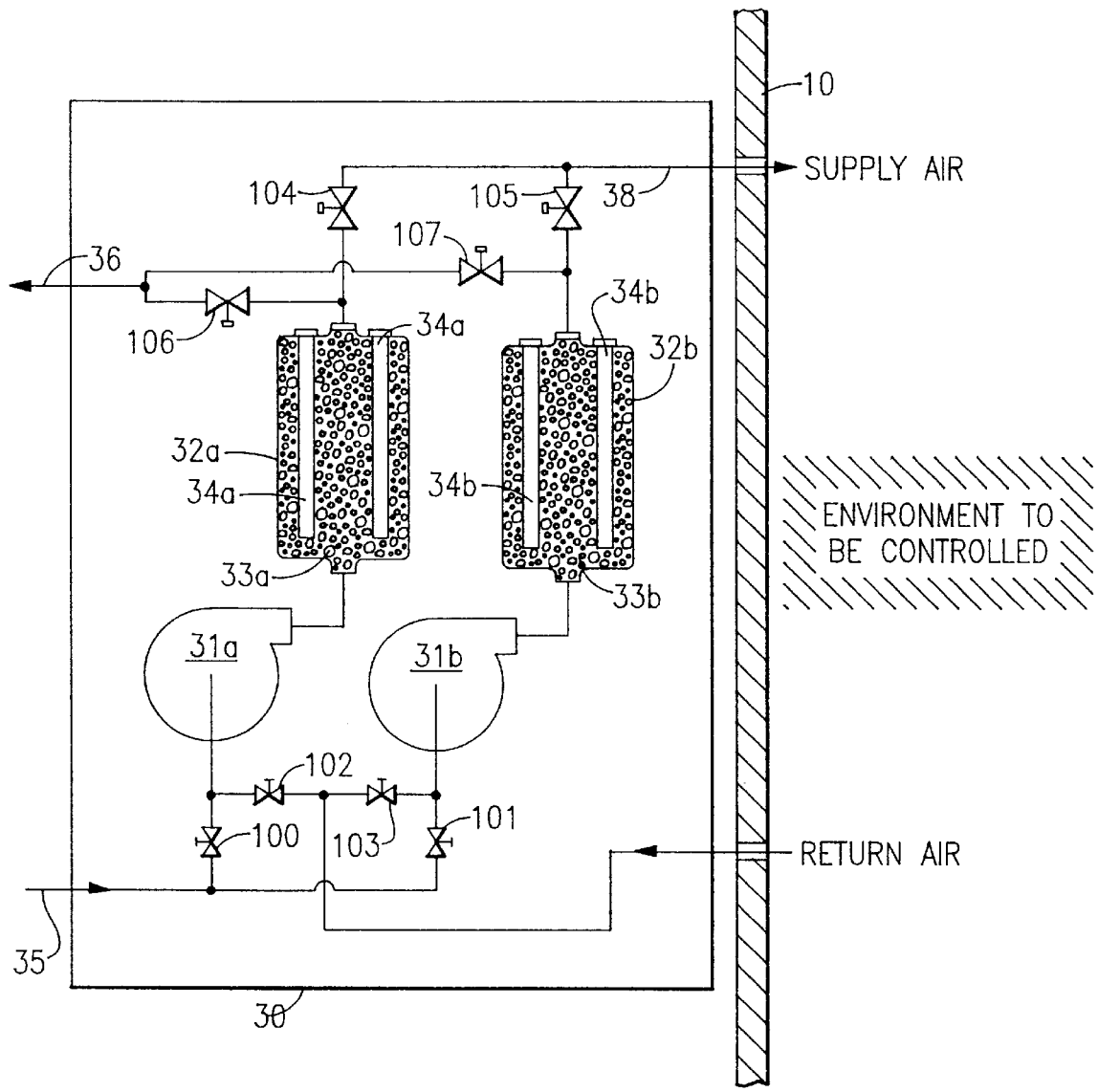
FIG. 2 is schematic diagram illustrating a detailed view of the humidity control portion shown in FIG. 1.

However, of significant importance to the present invention, there is provided a humidity control unit (HCU reference numeral 30) which receives air from within enclosure 10, removes moisture from this air and returns dry air to enclosure 10. In this regard, it is noted that a preferred embodiment of humidity control unit 30 such as that seen in FIG. 1 is provided in greater detail in FIG. 2. As shown in FIG. 2, conduit 37 penetrates frame 10 in a sealable manner (not specifically shown in this schematic view) to supply redundant air pumps 31a and 31b, which in turn supply relatively moist air to containers 32a and 32b, respectively, which contain desiccant material 33a and 33b, also respectively. Desiccant containers 32a and 32b contain, in addition to desiccant material 33a and 33b respectively, heaters 34a and 34b which can be activated for purging water from the desiccant in the respective containers. These heaters are preferably electric, but are not so limited.

Clearly, humidity control unit 30, as shown in FIG. 2, provides redundancy for continuous operation. In particular, when one of the redundant humidity control units in frame 30 is operating to remove water vapor from the interior of enclosure 10, the other redundant unit in unit 30 of FIG. 2 may be operated to reactivate the desiccant by heating desiccant material using one of the heaters. Accordingly, humidity control unit 30 receives higher humidity air from the interior of enclosure 10 through conduit 37 and returns lower humidity air to the interior of enclosure air 10 through conduit 38. In a similar fashion, humidity control unit 30 returns relatively high humidity air to the external environment through conduit 36 when air from the external environment supplied through conduit 35 is passed over heated desiccant.

In order to provide the desired degree of redundancy and desiccant purging, control valves 100–107, as shown in FIG. 2, are provided. These valves are either open or closed in accordance with the operation being performed. The table below summarizes the status of these valves during various ones of the operations indicated in the table below:

TABLE I

| Valve | Normal Operation Side a | Normal Operation Side b | Purging Desiccant Side a (Side b running) | Purging Desiccant Side b (Side a running) |
|---|---|---|---|---|
| 100 | Closed | Closed | Open | Closed |
| 101 | Closed | Closed | Closed | Open |
| 102 | Open | Closed* | Closed | Open |
| 103 | Closed* | Open | Open | Closed |
| 104 | Open | Closed* | Closed | Open |
| 105 | Closed* | Open | Open | Closed |
| 106 | Closed | Closed | Open | Closed |
| 107 | Closed | Closed | Closed | Open |

*Open if both sides running

Suitable materials for desiccant 33a and 33b include: silica gel, calcium chloride, activated alumina and calcium sulfate.

In order to provide enclosure 10 with positive internal pressurization, humidity control unit 30 contains the above-mentioned dual moisture control circuits for stand-by redundancy. Each of these circuits, as described above, contains an air pump And a desiccant chamber. Air from frame 20, which may be mixed With make-up air from the surrounding room is first somewhat compressed, which raises its temperature slightly, since enclosure 10 is preferably maintained at a slightly elevated pressure. During purging operations, air is passed through a desiccant chamber to remove moisture after which the dry air is resupplied to enclosure 10. It is noted that, for proper operation of humidity control unit 30, it is not necessary for enclosure 10 to be perfectly sealed. In this respect, humidity control unit 30 is used to ensure, by operation of compressors 31a and/or 31b, that the volume within enclosure 10 is maintained at a positive pressure. This ensures that any leakages are from the interior of enclosure 10 to the room rather than from the room into this enclosure. It is clearly undesirable that relatively moist, untreated room air enters enclosure 10. However, the presence of humidity control unit 30 renders it possible to employ less than perfect sealing for enclosure 10.

Figure 3A:
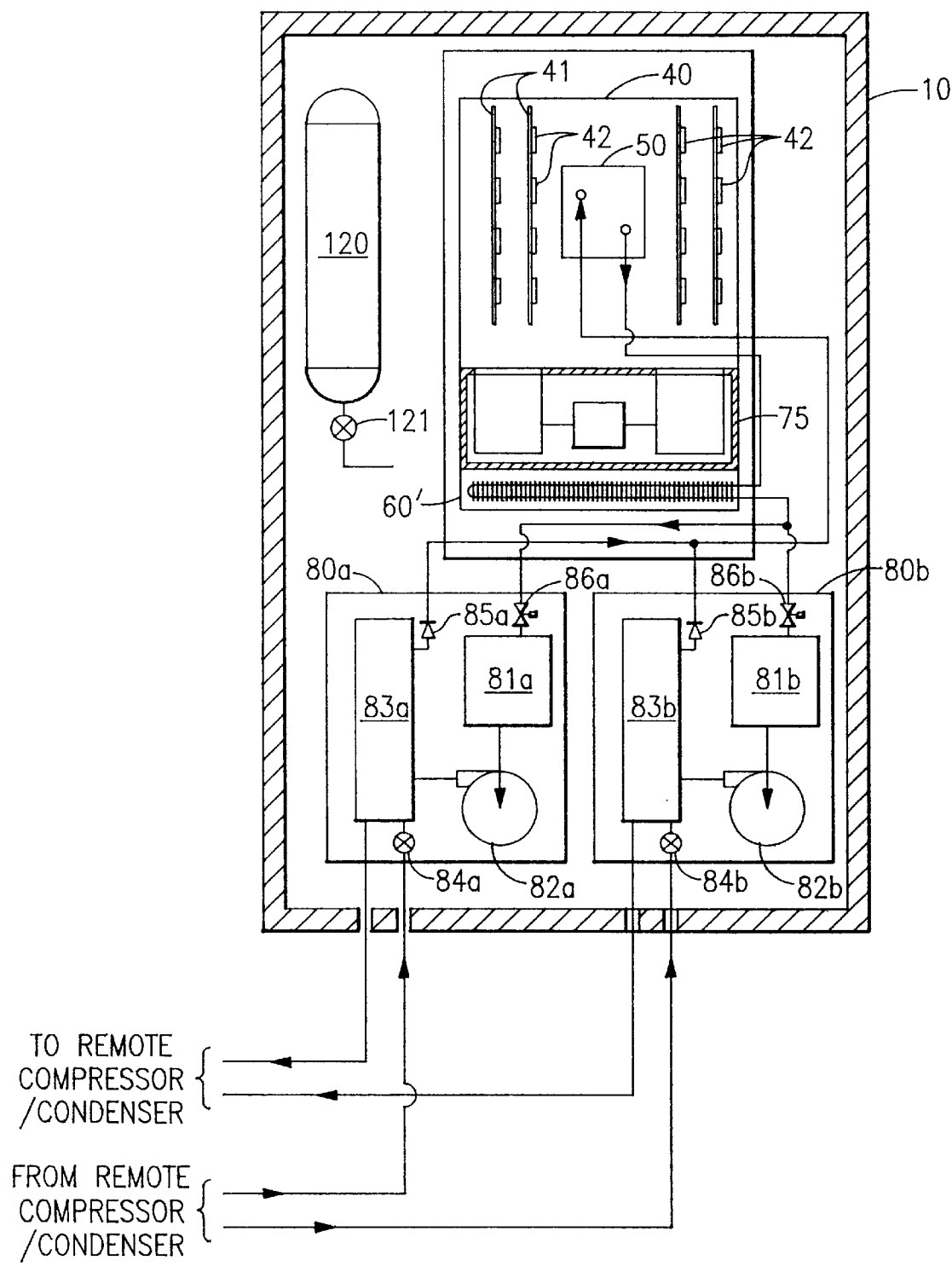
FIG. 3A is a front schematic view illustrating an alternative embodiment of the present invention employing multiple heat exchange fluids.

FIG. 3A illustrates another embodiment of the present invention which is particularly useful for employing more than one heat exchange fluid. For purposes of the present application, the term "heat exchange fluid" includes refrigerants. However, not every heat exchange fluid is a refrigerant. As used herein, the term "refrigerant" refers to a heat exchange fluid which is capable of being compressed and which produces a cooling effect upon expansion and evaporation. The second heat exchange fluid which flows through heat exchanger 60' and cold plate 50 is preferably a brine solution. The brine solution may consist of water mixed with a salt such as calcium chloride or sodium chloride to suitably depress the freezing point of the solution below the normal freezing point of water. The brine solution is not restricted to water and salt but may instead be glycol brines made from mixtures of water with glycerine, ethylene glycol, or propylene glycol to provide noncorrosive solutions. Alternatively, fluorochemical coolants could also be used as the secondary fluid. Brine solutions, however, because of the superior thermophysical properties of water will provide a higher transfer rate at a given fluid flow rate and are therefore preferred.

In the electronic cooling system shown in FIG. 3A, cooled refrigerant is supplied from a remote compressor/condenser as shown in FIG. 3A and as further illustrated in FIG. 1. However, in the system shown in FIG. 3A, refrigerant is supplied, from the external lines shown, to redundantly provided heat exchangers 83a and 83b. This refrigerant is supplied through expansion valves 84a and 84b, as shown. Heat exchangers 83a and 83b are designed to be, in preferred embodiments of the present invention, heat exchangers which are particularly adapted for transfer of heat between a refrigerant and a brine solution. Thus, there is provided an interior flow loop for circulation of brine as a heat exchange fluid from heat exchanger 83a through one-way check valve 85a to cold plate 50 and thence through heat exchanger 60' to expansion tank 81a, thence to circulating pump 82a and finally returning to heat exchanger 83a. A stand-by redundant system (side b) is also provided for availability and reliability of operations purposes. It works in the same fashion. Electrically operated shut-off valves 86a and 86b are provided in each flow loop to prevent flow from the active loop to the inactive loop. Heat exchanger 60' functions much the same way as heat exchanger 60 as seen in FIG. 1. However, heat exchanger 60' is particularly designed to be efficient for exchanging thermal energy between internally contained brine solution and air passing over the heat exchanger. In particular, as shown in FIG. 3A, this air passage is produced by means of blower 75. Other components are substantially as described above with respect to FIG. 1.

Figure 3B:
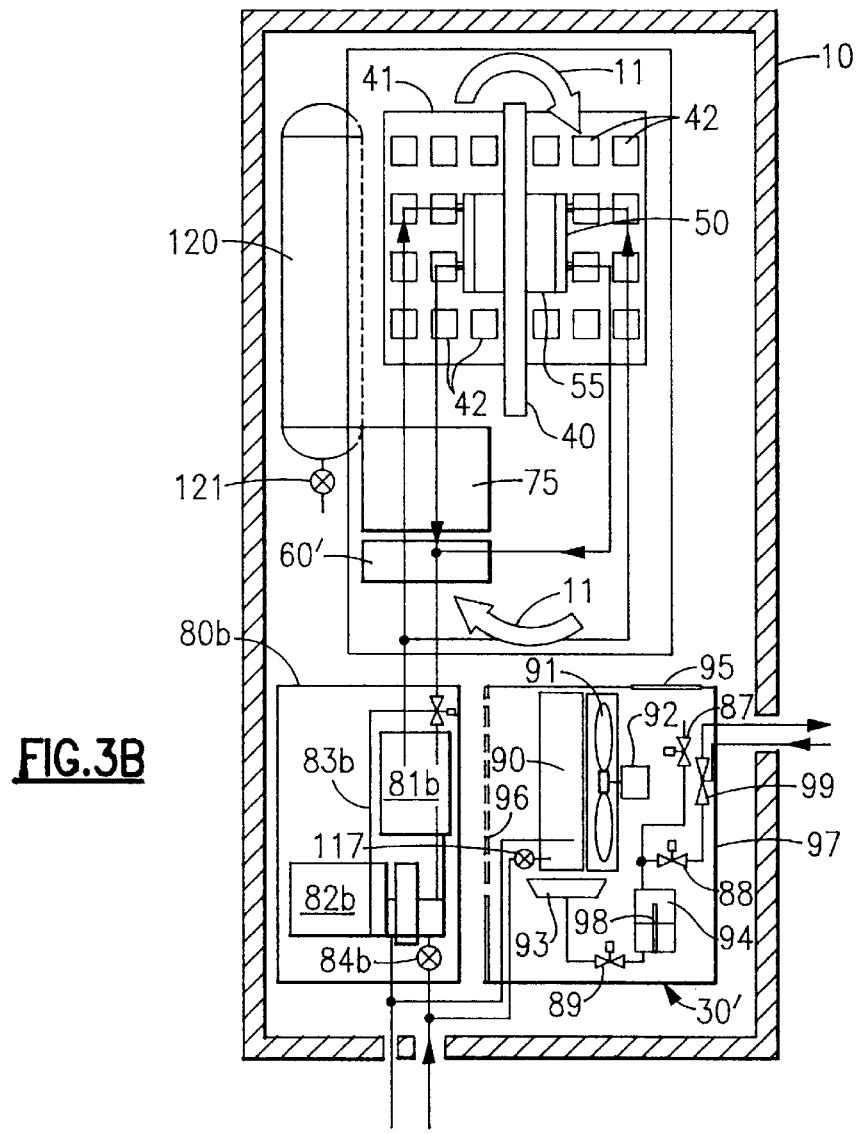
FIG. 3B is a side schematic view of the system shown in FIG. 3A.

In the embodiment of the present invention illustrated in FIG. 1, it is noted that humidity control unit 30 is external to enclosure 10. However, as seen in FIG. 3B, there is provided a variant form of humidity control unit 30' which is contained entirely or substantially entirely within the internal volume defined by enclosure 10. In particular, it is seen that the operation of humidity control unit 30' is driven by a portion of refrigerant material from the same sources as are illustrated in FIGS. 1 and 3A. In particular, it is seen that refrigerant is supplied via expansion valve 117 to heat exchanger 90 through which fan 91 driven by motor 92 moves air to cool it. In the process of so doing, condensed moisture is collected in collector (pan) 93 and then flows through normally open valve 89 to water removal unit 94 which is preferably closed but is otherwise vented by means of normally open value 87. It is noted, however, that rather than fan 91 and motor 92, any other convenient air-moving device may be employed. It is also further noted that water containment and removal apparatus 94 preferably includes electrical heater 98 which is turned on when the water level in the container reaches a certain level. At this point, valves 89 and 87 are closed and valve 88 is opened so that heater 98 evaporates collected water through valve 88 and thence through venturi 99 to the exterior of enclosure 10. Venturi 99 functions to introduce air into the outward-going moist air so as to prevent condensation from occurring on external surfaces and/or to prevent dripping. It is also noted that while FIG. 3B shows only a single visible one of humidity control units 30', preferred embodiments of the present invention include two such units for redundancy and reliability purposes. Thus, in the system illustrated in FIG. 3B, humidity control is provided by means of a refrigeration-type system while, in the system shown in FIG. 1, humidity control is instead provided by means of a desiccant. While the refrigeration-based system shown in FIG. 3B is typically costlier than a desiccant system, the system shown in FIG. 3B has the advantage that removal of collected water to the exterior of the entire unit may be accomplished at the same time that the control unit is operating to remove internal moisture.

It is also noted that humidity control unit 30' is preferably mounted within its own enclosure 97 which includes air inlet louvers or grill 95 together with corresponding air outlet grill or louvers 96. This is not to say, however, that the inlet/outlet roles of louvers or grills 95 and 96 cannot be reversed. In particular, whether air moves from the left or the right or from the right to the left through refrigerant air heat exchanger 90 is not critical.

Because of the fact that FIG. 3B is a side view, the relationship between cold plate 50 and module 55, which it cools, is more particularly visible in this figure. Additionally, FIG. 3B also illustrates preferential air-flow path 11 past chips 42 which are mounted on circuit boards 41 which, when provided in plurality, provide air-flow defining paths therebetween. Furthermore, it is seen that blower 75 operates to direct air flow upwards on the left side of back plane 40 and thence downwardly on its right side. This is also the preferential flow path for the embodiment illustrated in FIG. 1.

Figure 4:
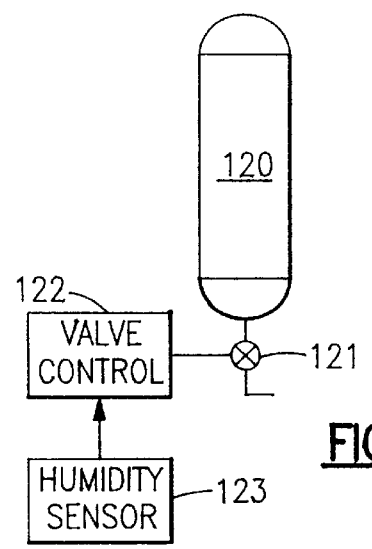
FIG. 4 is a schematic view illustrating a mechanism for maintaining positive dry air pressure within an enclosure.

FIG. 4 illustrates one system which employs dry air tank 120. While this tank is shown contained within enclosure 10 in FIGS. 3A and 3B, this tank may also be mounted on the exterior of the enclosure. Tank 120 contains pressurized dry air which is particularly useful for purging the atmosphere of enclosure 20 prior to start up of the cooled electronic system described herein. Furthermore, in one embodiment of the present invention, humidity may be controlled, within an enclosure which is not perfectly sealed, by opening valve 121 on tank 120 by means of valve control 122 which responds to humidity sensor 123. Clearly, humidity sensor 123 must be disposed within the interior of enclosure 10. However, while valve control 122 and tank 120 and valve 121 are preferably contained within enclosure 10, this is optional. A cooled electronic system may be operated in accordance with the present invention for limited periods of time with no humidity control other than that which is shown in FIG. 4. Such a humidity control mechanism is appropriate when the electronics module or components are cooled to sub-dew point temperatures. In this embodiment, tightness of sealing mechanisms for enclosure 10 is more critical.

As an alternate embodiment of the present invention, it is also noted that the refrigerant-based humidity control system illustrated in FIG. 3B could also be employed in place of the desiccant system shown in FIG. 1. This is equivalent to disposing humidity control unit 30' in FIG. 3B in place of humidity control unit 30 in FIG. 2.

From the above, it should be appreciated that the various embodiments of the present invention fulfill the various objects set forth above. Accordingly, it is seen that there is provided a system and method for providing a cooled electronic system or subsystem which is capable of operating at reduced temperatures and concomitantly higher speeds. It is furthermore seen that the systems of the present invention are preferably provided in a redundant manner so as to ensure continued operation of the electronic system in question particularly when that system is a computer system or computer complex serving a large plurality of real-time information customers.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cooled electronic system comprising:
   an electronic module in thermal contact with a cold plate through which a refrigerant can flow;
   a thermally insulated enclosure containing said module and said cold plate, said enclosure also being substantially sealed against entry of ambient air;
   refrigeration means, located exterior to said enclosure for supplying cooled refrigerant to said cold plate, said refrigeration means being capable of reducing the temperature of said cold plate to a point below the dew point of air within said enclosure; and
   refrigerant conduits for transporting said refrigerant to and from said cold plate, said conduits passing through said enclosure and connecting said refrigeration means in a closed loop with said cold plate.

2. The system of claim 1 further including means for adding positive pressure of dry air to the interior of said enclosure.

3. A cooled electronic system comprising:
   an electronic module in thermal contact with a cold plate through which a refrigerant can flow;
   a thermally insulated enclosure containing said module and said cold plate, said enclosure also being substantially sealed against entry of ambient air;
   refrigeration means, located exterior to said enclosure for supplying cooled refrigerant to said cold plate, said refrigeration means being capable of reducing the temperature of said cold plate to a point below the dew point of air within said enclosure;
   refrigerant conduits for transporting said refrigerant to and from said cold plate, said conduits passing through said enclosure and connecting said refrigeration means in a closed loop with said cold plate; and
   means for removing water vapor from within said enclosure.

4. The system of claim 3 in which said water vapor removal means comprises:
   an air circulating pump;
   a desiccant within a closed desiccant container;
   air transport conduits connecting the interior of said enclosure to said air circulating pump and to said desiccant container so as to form a closed air circulation loop which includes said enclosure interior, said air circulating pump and said desiccant container.

5. The system of claim 3 in which said means for removing water vapor is provided as a redundant pair of removal means together with control valve means for selecting which one of the pair is functioning at any given time.

6. The system of claim 5 further including heater means within said desiccant containers for purging water from said desiccant so as to at least partially restore its function and wherein said control valve means is operable to select which one of said pair is functioning as a water removing mechanism and which one is purging.

7. The water vapor removal means of claim 4 further including heater means within said desiccant container for purging water from said desiccant so as to at least partially restore its function.

8. A cooled electronic system comprising:

a first set of electronic components for which air cooling is sufficient;

a second set of electronic components for which air cooling is not as sufficient;

a thermally insulated enclosure containing said first set of electronic components and said second set of electronic components;

a cold plate through which a refrigerant can flow, said cold plate being in thermal contact with said second set of electronic components;

a refrigeration means, located exterior to said enclosure, for supplying cooled refrigerant to said cold plate, said refrigeration means being capable of reducing the temperature of said cold plate to a point below the dew point of air within said enclosure;

first refrigerant conduits for transporting said refrigerant to and from said cold plate, said conduits passing through said enclosure and connecting said refrigeration means in a closed loop with said cold plate;

an air/refrigerant heat exchanger;

second refrigerant conduits for transporting said refrigerant from said refrigeration means, through said air/refrigerant heat exchange and back to said refrigeration means;

air moving means for moving air through said heat exchanger and past the first set of electric componnts.

9. A cooled electronic system comprising:

an electronic module in thermal contact with a cold plate through which a heat exchange fluid can flow;

a thermally insulated enclosure containing said module and said cold plate, said enclosure also being sealed against entry of substantial amounts of ambient air;

a set of connecting conduits within said enclosure for transporting said heat exchange fluid;

a circulating pump within said enclosure for circulating said heat exchange fluid;

a heat exchanger within said enclosure, said circulating pump, said heat exchanger, said set of conduits and said cold plate being connected in a closed loop within said enclosure for transport of said heat exchange fluid through a loop which includes said heat exchanger, said cold plate, said pump and said set of conduits;

refrigeration means external to said enclosure for supplying cooled refrigerant to said heat exchanger by means of conduits passing through said enclosure, whereby thermal energy may be transported from said electronic module to said heat exchange fluid and thence to said refrigerant.

10. The system of claim 9 further including means for adding positive dry air pressure in the interior of said enclosure.

11. The system of claim 9 further including:

(1) an additional heat exchanger in said loop for exchanging thermal energy between ambient air within said enclosure and said heat exchange fluid in said loop; and (2) an air moving device for passing said ambient air through said additional heat exchanger, whereby there is produced cooler air for cooling other electronic components within said enclosure.

12. The system of claim 9 further including means for removing water vapor from within said enclosure.

13. The system of claim 3 whereby said means for removing water vapor additionally maintains a positive pressure of dry air within said enclosure.

* * * * *